US 6,704,904 B1

(12) United States Patent
Erskine

(10) Patent No.: US 6,704,904 B1
(45) Date of Patent: *Mar. 9, 2004

(54) METHOD AND APPARATUS FOR PERMUTING CODE SEQUENCES AND INITIAL CONTEXT OF CODE SEQUENCES FOR IMPROVED ELECTRICAL VERIFICATION

(75) Inventor: Keith Hall Erskine, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/541,253

(22) Filed: Apr. 3, 2000

(51) Int. Cl.[7] .............................. G06F 7/02; G06F 19/00
(52) U.S. Cl. ..................... 714/819; 714/736; 702/120
(58) Field of Search ................................. 714/702, 720, 714/724, 718, 728, 738, 739, 745, 101, 35, 819; 324/527; 327/100; 708/209; 702/120

(56) References Cited

U.S. PATENT DOCUMENTS

| | | | | | |
|---|---|---|---|---|---|
| 4,782,487 A | * | 11/1988 | Smelser | ...................... | 714/723 |
| 5,033,048 A | * | 7/1991 | Pierce et al. | ................. | 714/719 |
| 5,095,525 A | * | 3/1992 | Almgren et al. | ............ | 711/202 |
| 5,305,327 A | * | 4/1994 | Huckstepp | ................... | 714/720 |
| 5,469,443 A | * | 11/1995 | Saxena | ........................ | 714/720 |
| 5,541,942 A | * | 7/1996 | Strouss | ........................ | 714/720 |
| 5,961,653 A | * | 10/1999 | Kalter et al. | ................... | 714/7 |
| 6,564,162 B1 | * | 5/2003 | Erskine | ...................... | 702/120 |

* cited by examiner

*Primary Examiner*—Albert Decady
*Assistant Examiner*—Matthew C. Dooley

(57) ABSTRACT

Multiple verification cases consisting of code sequence and initial context, and suitable for electrical verification testing of a device, are generated from a single verification case by permuting, or changing, the code sequence, by either permuting the initial context of the code sequence or permuting the code sequence itself. The code sequence is an array of computer instructions to be executed by a computer and the initial context of the code sequence refers to the environment in which the code sequence is to be run.

31 Claims, 2 Drawing Sheets

METHOD AND APPARATUS FOR PERMUTING CODE SEQUENCES AND INITIAL CONTEXT OF CODE SEQUENCES FOR IMPROVED ELECTRICAL VERIFICATION

CROSS REFERENCES TO RELATED APPLICATIONS

The subject matter of the present application is related to copending U.S. application, Ser. No. 09/541,423 now U.S. Pat. No. 6,564,162, titled "Method and Apparatus for Improving Electrical Verification Throughput via Comparison of Operating-Point Differentiated Test Results", assigned to the assignee hereof and herein incorporated by reference.

FIELD OF THE INVENTION

The present invention relates generally to the electrical verification of devices, such as microprocessors, digital signal processing (DSP) devices, and application specific integrated circuits (ASICs), that are capable of emulating their own results, and more particularly to a method and apparatus for improving electrical verification throughput of such devices by permuting code sequences and initial context of code sequences.

BACKGROUND OF THE INVENTION

Electrical verification of devices is performed to detect various electrical failures or weaknesses, as opposed to functional failures, of the devices. Electrical failures or weaknesses may be considered to be related to the electrical parameters, such as frequency, voltage, or temperature, that define the operating point under which a device must operate. The electrical robustness and reliability of the device may therefore be tested by subjecting the device to particular code sequences that are designed to test the electrical parameters of the device.

To date, electrical verification of devices that are capable of emulating their own results, such as microprocessors, digital signal processing (DSP) devices, and application specific integrated circuits (ASICs), has been heavily dependent upon software emulation of the device to generate predicted results against which actual results, generated by actually running an appropriate test case or code sequence on the device itself, can be compared. The comparison of actual and predicted test results provides an indication of how well the device is performing. A major drawback of this approach to electrical device verification is that it is inherently slow due to the vast majority of time that is spent in software emulation generating the predicted results. A related concern is the problem of tracking down emulation problems, commonly known as "emulation bugs," that are often associated with software emulation.

One approach that may be employed to circumvent the need to employ software emulation to obtain predicted results is to compare the device being tested to a known good part or device that serves as a standard against which a device to tested may be compared. By comparing test results of the device being tested to the test results associated with the known good part, deficiencies of the device being tested may be readily identified. This approach, however, depends upon the existence of a known good part that can serve as the standard. In those situations in which the device is a new technology for which there does not yet exist a known good part this approach is not feasible.

There is therefore an unmet need in the art to be able to enhance electrical verification of devices by lessening the dependence upon software emulation and testing using known good devices. Such an approach can be expected to lessen the time required for electrical verification, minimize the occurrence of emulation bugs, and otherwise render a more efficient electrical verification process.

SUMMARY OF THE INVENTION

Therefore, according to the present invention, a method for permuting code sequences and the initial context upon which a code sequence operates provides for test cases used for electrical verification of devices to be quickly created. The methodology comprises running a code sequence on the device to generate first results, permuting the code sequence, and running the permuted code sequence on the device to generate second results. Permuting the code sequence may refer to permuting an initial context under which the device operates, referred to as context permutation, or permuting the code sequence itself. Context permutation allows those electrical failures of the device that are dependent upon initial context data values to be quickly discovered and provides for an improved rate of detection of electrical device failures. Permuting the code sequence itself allows for more robust testing of the device by providing a better suite of verification code sequences than could be achieved by modifying only the initial context of the code sequence.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DESCRIPTION OF THE INVENTION

Multiple verification cases consisting of code sequence and initial context, and suitable for electrical verification testing of a device, are generated from a single verification case by permuting, or changing, the code sequence, by either permuting the initial context of the code sequence or permuting the code sequence itself. The code sequence is an array of computer instructions to be executed by a computer. The initial context of the code sequence refers to the environment in which the code sequence is to be run and is defined by a variety of factors, including, but not limited to, values contained in general register tables, floating point register tables, and cache memory tables, for instance.

Permutinq the Initial Context Under Which a Code Sequence is Run

The permutation technique of the present invention for permuting the initial context upon which a code sequence operates, referred to as context permutation, quickly creates new data values contained within a data table stored within a storage element of the device, such as new floating point numbers of a floating point register table or new memory values of a cache memory table, for instance, by inverting the value of a contiguous sub-range of bits of an existing data value of the table. The bit width, or width, of the sub-range, as measured by the number of bits, and the bit position, or offset, within the range of bits of the existing data value (defined as an offset within a number, such as an offset within 32/64 bit number) are varied to create mathematically significant operands, such as floating point operands. The ability to create mathematically significant operands, by inverting contiguous sub-ranges of bits, is significant. Contiguous strings of 1's and 0's are mathematically important cases for exciting adder carry chains, rounding corner cases, etc. The stored data value to be permuted may be a 32-bit, a 64-bit number, or an upper half or a lower half of a number, such as the upper 32 bits or lower 32-bits of a 64-bit word, for instance.

Figure 1:
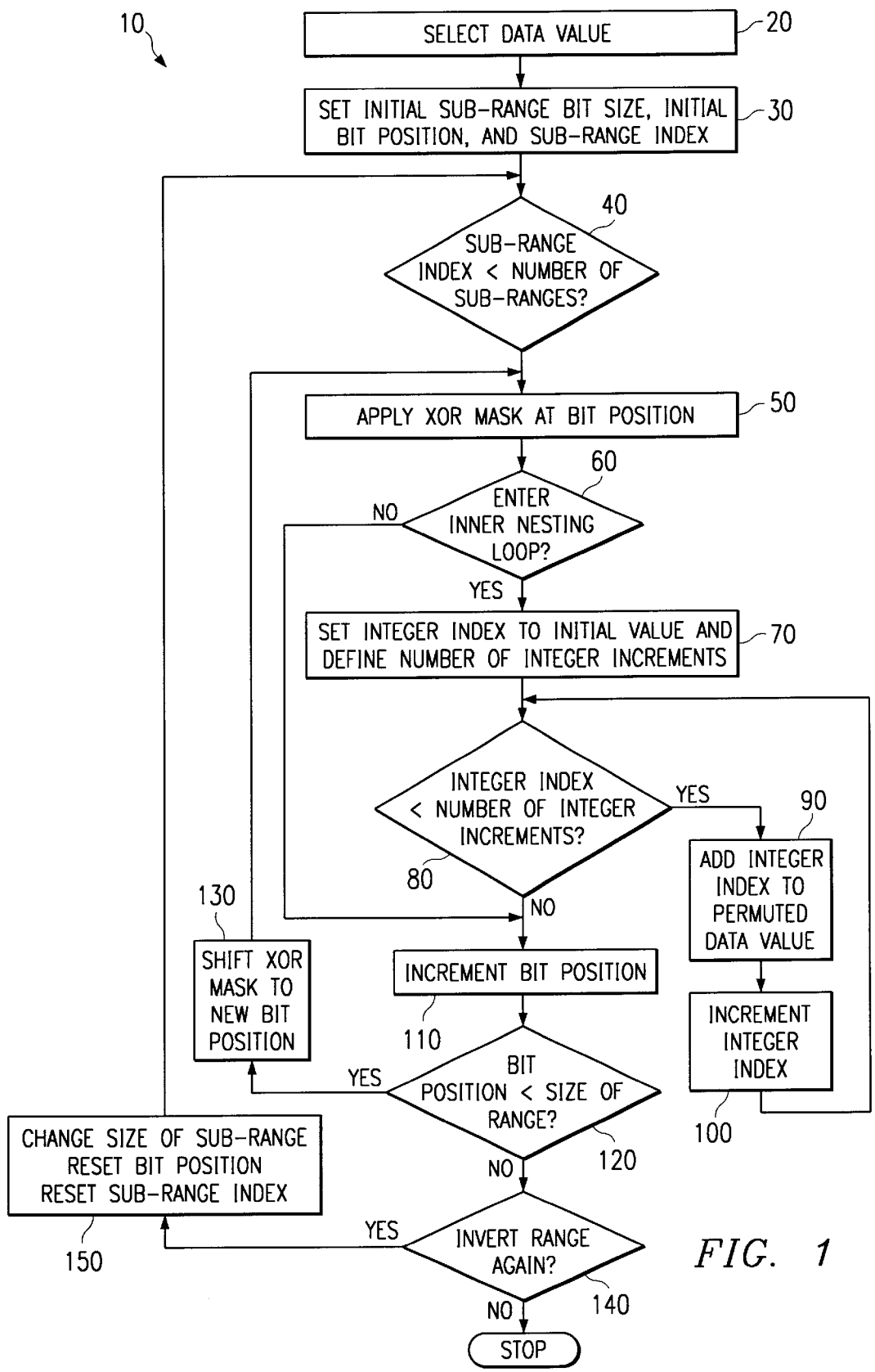
FIG. 1 illustrates the methodology for permuting an initial context under which a device runs a code sequence, in accordance with the present invention.

Referring now to FIG. 1, a flow 10 for permuting an initial context under which a device runs a code sequence is illustrated. At Block 20, a data value to be permuted is selected; the data value at least in part helps define the initial context and thus permuting the data value will allow the initial context under which the code sequence is run to be at least partially permuted. The data value may be contained within a data table of a storage element of the device, such as a floating point register, a general-purpose register, or a cache memory. The data value has a number of bits arranged in a range that define the bit width of the data value. Next, at Block 30, various values must be defined. The range of bits that define the data value are grouped in contiguous sub-ranges, from a least significant to a most significant sub-range, the bit width of which defines the number of sub-ranges. Thus, the sub-range bit width is set to an initial value. If the number of bits of the range of bits is evenly divisible by the initial value of the sub-range bit width, then all sub-ranges have the same, uniform sub-range bit width. If, however, the number of bits of the range are not evenly divisible by the selected initial value of the sub-range bit width, meaning there is a remainder, then all of the sub-ranges are the same, uniform selected bit width except for the most significant sub-range, which has a bit width determined by the remainder. Consider, for instance, a 32-bit number. The range of bits is 32 bits. If a sub-range bit width of 8 bits is selected, then there will be 4 contiguous sub-ranges each being 8 bits in width since the 32 bits of the range are evenly divisible by the 8 bits of the sub-range bit width. If the sub-range bit width were selected to be 6 bits, however, than there would be 6 sub-ranges. The first 5 sub-ranges would have a bit width of 6 bits but the $6^{th}$ sub-range would have a bit width of 2 bits, the remainder when 32 is divided by 6. The $6^{th}$ sub-range is referred to as the most significant sub-range since its 2 bits are the 2 most significant bits (MSBs) of the range.

In addition to setting the bit-width of the sub-ranges at Block 20, the initial bit position within the range of bits is set and a sub-range index is also set to an initial value. The bit position indicates on which bits within the range the exclusive OR mask (XOR) is to operate and thus the bit position is dependent upon the sub-range width selected. Initially, the bit position is set to 1 or the least significant bit (LSB) within the range of bits. The sub-range index keeps track of the number of sub-ranges to which the XOR mask has been applied; the initial value of the sub-range index is normally 1.

Next, at Decision Block 40, the sub-range index is compared to the number of sub-ranges in the range. Again, the number of sub-ranges in the range is determined by dividing the bit width of the range by the bit-width of the sub-range. If the sub-range index is less than the number of sub-ranges, then at Block 50 the XOR mask is applied to the sub-range indicated by the bit position, which means that the XOR mask is first applied to the first, or least significant, sub-range containing the least significant bits (LSBs) of the range. Applying the XOR mask to the selected sub-range inverts the bits contained within that range to permute the original data value.

After the mask has been applied to a sub-range to invert the bits of that sub-range and thus generate a permuted value, further permutation on that permuted value may be optionally performed at the inner (minor) nesting loop represented by Blocks 60–100. At Decision Block 60, the inquiry is whether the inner nesting loop is to be entered to add N incremental values to the permuted data value. If yes, then at Block 70, an integer index is set to an initial value, such as 1, and the predetermined number of increments N is defined. The initial integer index is compared to the predetermined number of increments N at Decision Block 80 and if the integer index is less than N, indicating that the permuted data value is to be incremented, then the permuted data value is incremented by adding the integer index to it at Block 90 and the integer index is incremented at Block 100 as shown. The inner nesting loop of Blocks 60–100 are optional and not necessary to a practice of the invention. The flow of FIG. 1 could continue directly from Decision Block 60 to Block 110 if the inner nesting loop is not to be entered.

After the mask has been applied to the selected sub-range to yield a permuted data value at Block 50, and the optional integer incrementation of the permuted data value has been performed at Blocks 60–100 if desired, then the bit position is incremented at Block 110 so as to indicate or correspond to the next, contiguous sub-range; thus, the bit position is incremented by the bit-width of the sub-ranges. For example, if sub-range width is 7 bits than the bit position would be incremented to correspond to the $8^{th}$ bit within the range. At Block 120, the inquiry is whether the now-incremented bit position is less than the bit width of the range; this inquiry will provide an indication of whether additional sub-ranges are to be permuted. If the incremented bit position is less than the bit width of the range, an indication that there are sub-ranges that have not yet been permuted, then at Block 130 the XOR mask shifts to the incremented bit position of the next, contiguous sub-range and the flow returns to Block 50 to apply the mask to this sub-range. This flow is repeated until, at Decision Block 120, the bit position is no longer less than the width of the range, and all of the sub-ranges and thus the data value selected at Block 20 has been fully inverted. At this point, the flow progresses to Decision Block 140 where the inquiry is whether the range of bits is to inverted again (thereby allowing the initial data value selected at Block 20 to be re-generated. If no, then the flow 10 ends. If yes, then the bit width of the sub-ranges is changed, the bit position within the data range is reset, and the sub-range index is reset at Block 150. Changing the bit width of the sub-ranges, such as increasing the bit width, has the effect of allowing different, mathematically significant operands or data values to be generated by the permutation process, as the bits within the sub-ranges will change with the sub-range width. The flow will return to Decision Block 40 and subsequently to Blocks 50–140 to permute the inverted data value generated the first time through and eventually yield the original data value selected at Block 20.

It is noted that each of the permuted data values that are generated by the flow 10 of FIG. 1 may be optionally stored in the storage element, such as within a data table of a storage element of the device if so desired.

An example of how the methodology of the present invention may be practiced will now be described in conjunction with Tables 1–3 below. In Table 1 a 32-bit number ffffffff is selected; this data value will be permuted by the method disclosed in FIG. 1. A sub-range bit width of 7 is chosen, so that 5 sub-ranges are defined: the first 4 sub-ranges will have a bit width of 7 but the 5$^{th}$ and most significant sub-range will have a bit width of 4, the remainder of dividing the 32-bit width of the range by the sub-range bit width of 7. The resultant permuted data values generated by sequentially applying the XOR mask to the contiguous sub-ranges of the range, starting with the least significant sub-range, is shown in Table 1.

TABLE 1

| STEP | 32-BIT NUMBER | RESULTANT NUMBER (PERMUTED DATA VALUE) |
|---|---|---|
| Original Number (data value) | 1111 1111 1111 1111 1111 1111 1111 1111 | ffffffff |
| Step 1 | 1111 1111 1111 1111 1111 1111 1000 0000 | ffffff80 |
| Step 2 | 1111 1111 1111 1111 1100 0000 0000 0000 | ffffc000 |
| Step 3 | 1111 1111 1110 0000 0000 0000 0000 0000 | ffe00000 |
| Step 4 | 1111 0000 0000 0000 0000 0000 0000 0000 | f0000000 |
| Step 5 | 0000 0000 0000 0000 0000 0000 0000 0000 | 00000000 |

In step 1, it can be seen that the XOR mask is applied to the first seven, contiguous bits in bit locations 0–6 (LSBs) of the first, least significant sub-range in order to invert (flip) each of the bits of this sub-range from 1 to 0. After step 1, the bit position is incremented from bit position 0 to bit position 7 by adding the width of the sub-range (7) to the initial bit position (0). In step 2, the next seven, contiguous bits (in bit locations 7–13) of the next, contiguous sub-range are flipped from all zeroes to all ones by applying the XOR mask at the new bit position of the 7$^{th}$ bit. The bit position is again incremented, this time to bit position 14. In step 3, the next seven, contiguous bits in bit locations 14–20 of the third sub-range are inverted to all ones by the XOR mask and the bit position is incremented to bit position 21. Similarly, in step 4, the next seven, contiguous bits in bit locations 21–27 of the fourth sub-range are each flipped or inverted from zero to one by the XOR mask; the bit position is changed to bit position 28. Finally, in step 5 the last four contiguous bits of the fifth and final sub-range of the 32-bit number are inverted by the mask. The bit position would normally be incremented to bit position 35; even though there is no such bit position since the range is 32 bits, the bit position will be subsequently reset to 1 is the range is to again be inverted (please refer to Blocks 140 and 150). A total of five permuted data values have been generated in Table 1. Once the entire number has been inverted in this manner, then the contiguous sub-range increases in width from 7 to 8 bits and the process of inverting the inverted 32-bit number yielded by the steps of Table 1 proceeds anew as shown in Table 2 if the answer to Decision Block 140 has indicated that the data range is to be inverted again. At Decision Block 150 the bit position of 36 would be reset to bit position 0; additionally, the bit width of the sub-range will be changed and the sub-range index will be reset, as explained above.

TABLE 2

| STEP | 32-BIT NUMBER (Pattern) | RESULTANT NUMBER (PERMUTED DATA VALUE) |
|---|---|---|
| Number generated by Table 1 (inverted data value) | 0000 0000 0000 0000 0000 0000 0000 0000 | 00000000 |
| Step 6 | 0000 0000 0000 0000 0000 0000 1111 1111 | 000000ff |
| Step 7 | 0000 0000 0000 0000 1111 1111 1111 1111 | 0000ffff |
| Step 8 | 0000 0000 1111 1111 1111 1111 1111 1111 | 00ffffff |
| Step 9 | 1111 1111 1111 1111 1111 1111 1111 1111 | ffffffff |

In Table 2, it can be seen that the sub-range bit width has increased from 7 bits to eight bits; this means that there are 4 sub-ranges, as opposed to the 5 in Table 1, each have the same number of bits-8. The process of applying the XOR mask to each of the sub-ranges, starting with the least significant sub-range, and incrementing the bit position after each permutation, proceeds as explained above. Notice that after inverting bits sequentially across the entire 32-bit number twice, the original data value is returned. Three additional permuted numbers will be generated before re-generating the original number ffffffff. It can be seen that between Table 1 and Table 2 a total of eight permuted data values have been generated by permuting the initial data value of fffff.

For each of the data patterns created in Tables 1 and 2 above, another inner nesting loop that adds another integer increment amount to the resultant or permuted number can be implemented. For example, if an inner nesting integer increment value of 5 is selected, 5 values are created for each of the patterns identified in Tables 1 and 2 by adding 1, 2, 3, 4, and 5 to each of the pattern. Thus, for the first pattern of 1111 1111 1111 1111 1111 1111 1000 0000 identified by Step 1 of FIG. 1, the inner nesting integer increment value of 5 would be implemented as shown below in Table 3.

TABLE 3

| STEP | 32-BIT NUMBER | RESULTANT NUMBER (PERMUTED DATA VALUE) |
|---|---|---|
| Number from Step 1 of Table 1 | 1111 1111 1111 1111 1111 1111 1000 0000 | ffffff80 |
| Increment Step 1 | 1111 1111 1111 1111 1111 1111 1000 0001 | ffffff81 (+1) |
| Increment Step 2 | 1111 1111 1111 1111 1111 1111 1000 0010 | ffffff82 (+2) |
| Increment Step 3 | 1111 1111 1111 1111 1111 1111 1000 0011 | ffffff83 (+3) |
| Increment Step 4 | 1111 1111 1111 1111 1111 1111 1000 0100 | ffffff84 (+4) |
| Increment Step 5 | 1111 1111 1111 1111 1111 1111 1000 0101 | ffffff85 (+5) |

By incrementing the data values for each position of the XOR mask, less redundant values are generated, because the new XOR mask will operate on the result of the previous XOR mask and the integer increment. For the above example, five additional incremented data values would be generated for each of the permuted data values generated in Tables 1 and 2 for a total of 40 permuted data values.

The above algorithm allows the user to select whether just one register should be modified, all registers should be modified, even numbered registers should be modified, or odd number registers should be modified. The algorithm also allows selection of modifying the upper half, lower half, or both halves of a 64-bit word, assuming that the 32-bit number described above is used.

Permuting the initial context upon which the code sequence operates allows those electrical failures of the device that are dependent upon initial context data values to be quickly discovered. Each of the permuted data values generated above represents permutation to the initial context in which the device must run the code sequence and are thus extremely useful for improved electrical verification of the device. A benefit of this technique of permutation is that it largely avoids repetitive data values that might otherwise be created by a technique that randomly sets and clears random bit ranges. Moreover, the present invention provides for permuted context values to be quickly generated and to provide for an improved rate of detection of electrical failures on devices such as microprocessors, DSP devices, and ASICs.

Permuting the Code Sequence

In addition to permuting the initial context of a code sequence, the present invention additionally provides for permuting the code sequence itself to render a permuted code sequence suitable for enhanced electrical verification of a device. Suppose, for instance that an instruction in an initial code sequence to be permuted into a permuted code sequence is:

fadd fr8, fr9, fr10, in which fr8, frg9, and fr10 represent operand a, operand b, and the target, as is understood in the art for a floating point operation in which:

$$\frac{operand\ a(fr8)\ +\ operand\ a(fr9)}{target\ (fr10)}$$

This instruction in the code sequence could be modified a variety of ways. For example, operand a (fr8) could be changed to a different register, as could operand b (fr9) or the target (fr10). The operation itself could be changed from a fadd operation to a different operation; however, changing the operation of a particular instruction of the code sequence presents the increased difficulty of generating correct instruction format for different instructions. This can be particularly true for some computer architectures having less regular instruction format. In this sense, it may be more straightforward to simply change the operands or targets of an instruction. PA-RISC computer architecture, however, was designed specifically to remedy this difficulty through the use of highly regular instruction formats that are broken into four classes according to the number of operands or targets. A trivial decoding of specific fixed bit positions within the instruction opcode reveals the class of the instruction.

Another example of the difficulty of changing instruction types blindly is changing the fadd fr8, fr9, fr10 code sequence to a memory accessing instructions, such as fload into target register fr10. Since operands fr8, fr9 are random floating point numbers, they cannot be arbitrarily used as indexes into computer memory because they could cause hardware faults such as cache misses, TLB misses, etc. For this reason, the special subset of general registers that are designated as address registers for memory accessing instructions are not generally modified.

Figure 2:
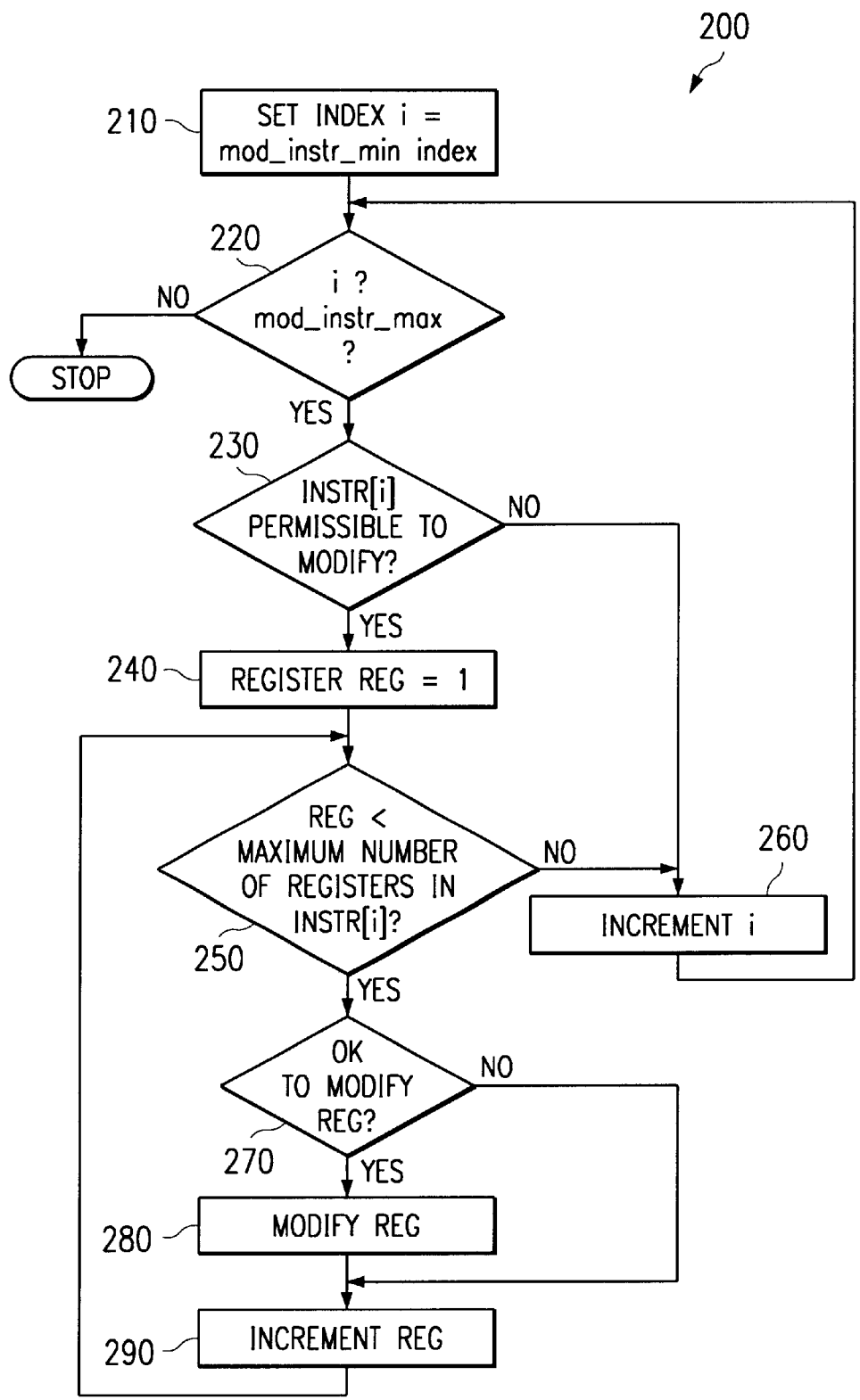
FIG. 2 illustrates the methodology for permuting a code sequence or instruction range to be modified, in accordance with the present invention.

Referring now to FIG. 2, flow 200 illustrates a methodology for permuting the code sequence itself. The code sequence or instruction range to be modified is defined as Instr[1 . . . n], an array of instructions, or instructional opcodes, from 1 to n. At Block 210, an instruction index i is initially set to the mod_instr_min index, the minimum index from 1 . . . n of the instruction range to be modified. Next, at Decision Block 220, the inquiry is whether the index i is less than the mod_instr_max index, the maximum index from 1 . . . n of the instruction range to be modified. If no, then the flow stops. If yes, then at Decision Block 230 the inquiry is whether instruction instr[i] of a type that is permissible to modify, as described above. Instruction instr[i] generally denotes a class of instruction other than floating point operation or floating point load/store instructions. Decision Block 230 checks to make sure that instruction instr[i] is okay to modify. For instance, if a user specified to modify the third operand of a three-operand instruction, such as fmpyadd a,b,c (a+b)*c→c, it would not be permissible or meaningful to modify a fadd operation with one two operands opa & opb. If the instruction instr[i] is not the type of instruction permissible to modify, then the index i is incremented at Block 260. Otherwise, the flow continues to Block 240 to set register field index REG to 1; register field index REG assists in considering all of the registers fields contained within an instruction. At Decision Block 250, REG index is compared to the maximum number of register fields contained within instr[i]. For instance, an instruction load (gr5), fr1 has two register fields in it while another instruction add gr1, gr2, gr3 has three register fields. If REG is not less than the maximum number of register fields contained within instr[i], then the index i is incremented at Block 260. If, however, REG is less than the maximum number of register fields contained within instr[i], then the inquiry at Decision Block 270 is whether it is permissible to modify the register field indicated by register field index REG. In other words, has a user of the device indicated that the particular register field is okay to modify? If no, then the register field index REG is incremented at Block 290 to point to a different register field within the instruction i. If yes, then the register index REG is modified in some desirable manner at Block 270 before register index REG is incremented at Block 290.

Permuting the code sequence itself provides the additional benefits of more robustly testing the device for electrical failures or weaknesses by exercising new interlocks, pipeline stalling, result bypassing, introducing new register data dependencies, etc. of the device. Modifying the code sequence itself gives a more robust suite of verification code sequences than can be achieved by only modifying the initial context of the code sequence.

An additional benefit of the ability to modify specific elements of the initial context of a code sequence or to modify the code sequence itself is that it enhances productive debugging of code sequences that reveal electrical failures of the device. Thus, for instance, if the instruction: fadd fr7, fr8, fr9 fails, then different register values for fr7 and fr8 could be tested to ascertain whether new register values allow the device to pass electrical verification testing. Moreover, examination and interpretation of failing patterns that might emerge may provide insight into the nature of a particular electrical failure.

While the invention has been particularly shown and described with reference to a preferred embodiment, it will be understood by those skilled in the art that various changes in form and detail may be made therein without departing from the spirit and scope of the invention.

What is claimed is:

1. A method for performing electrical verification of a device, comprising:
   running a code sequence on the device to generate first results;
   permuting the code sequence;
   running the permuted code sequence on the device to generate second results; and
   comparing the second results to the first results to determine if there is a match between the second results and the first results.

2. The method of claim 1, wherein permuting the code sequence includes permuting an initial context under which the device operates, comprising:
   A) selecting a data value having a number of bits of a range, stored in a storage element of the device and defined by a plurality of contiguous sub-ranges with each sub-range having a uniform bit width defined by a number of bits except for a most significant sub-range if the number of bits of the range divided by the number of bits of the uniform bit width yields a remainder in which the most significant sub-range has a bit width defined by the remainder, that in part defines the initial context;
   B) sequentially permuting each contiguous sub-range of the plurality of sub-ranges of the data value to generate a plurality of permuted data values and thus a plurality of permuted initial contexts; and
   C) running the code sequence on the device under each permuted initial context of the plurality of permuted initial contexts.

3. The method of claim 2, wherein permuting the data value to generate the permuted data value comprises:
   B.1) inverting a least significant contiguous sub-range of a plurality of contiguous sub-ranges of the data value to generate an initial permuted data value;
   B.2) incrementing a bit position within the range of bits of the data value by an amount equal to the bit width of the contiguous sub-range;
   B.3) inverting a contiguous sub-range indicated by the incremented bit position to generate a permuted data value; and
   B.4) repeating B.2) and B.3) for all remaining contiguous sub-ranges of the plurality of contiguous sub-ranges to generate a plurality of permuted data values, one for each contiguous sub-range, until the range of bits has been fully inverted to generate an inverted data value.

4. The method of claim 3, further comprising:
   after inverting the least significant contiguous sub-range to generate the initial permuted data value, incrementing the initial permuted data value N times to generate N incremental initial permuted data values.

5. The method of claim 4, wherein incrementing the initial permuted data value N times to generate N incremental initial permuted data values comprises:
   B.1.a) setting an integer index to an initial value and selecting a predetermined number of increments N;
   B.1.b) comparing the integer index to the predetermined number of increments N; and
   B.1.c) if the integer index is less than the predetermined number of increments N, incrementing the initial permuted data value, incrementing the integer index, and repeating B.1.a)–B.1.b).

6. The method of claim 3, further comprising:
   B.4) after inverting the contiguous sub-range to generate the permuted data value, incrementing the permuted data value N times to generate N incremental permuted data values.

7. The method of claim 6, wherein incrementing the permuted data value N times to generate N incremental permuted data values comprises:
   B.3.a.i) setting an integer index to an initial value and selecting a predetermined number of increments N;
   B.3.a.ii) comparing the integer index to the predetermined number of increments N; and
   B.3.a.iii) if the integer index is less than the predetermined number of increments N, incrementing the permuted data value, incrementing the integer index, and repeating B.3.a.i)–B.3.a.iii).

8. The method of claim 3, further comprising:
   B.5) changing the uniform bit width of the plurality of contiguous sub-ranges;
   B.6) inverting a least significant contiguous sub-range of the plurality of sub-ranges of the inverted data value to generate an initial permuted inverted data value;
   B.7) incrementing the bit position within the range of bits by an amount equal to the changed uniform bit width;
   B.8) inverting a contiguous sub-range indicated by the incremented bit position to generate a permuted inverted data value;
   B.9) repeating B.7) and B.8) for all remaining contiguous sub-ranges of the plurality of contiguous sub-ranges to generate a plurality of permuted inverted data values, one for each contiguous sub-range, until the range of bits has been fully inverted to re-generate the data value.

9. The method of claim 8, wherein changing the uniform bit width comprises increasing the uniform bit width.

10. The method of claim 8, wherein changing the uniform bit width changes the number of contiguous sub-ranges of the plurality of contiguous sub-ranges.

11. The method of claim 8, further comprising:
    after inverting the least significant contiguous sub-range to generate the initial permuted inverted data value, incrementing the initial permuted inverted data value N times to generate N incremental initial permuted inverted data values.

12. The method of claim 11, wherein incrementing the initial permuted inverted data value N times to generate N incremental initial permuted inverted data values comprises:
    B.6.a) setting an integer index to an initial value and selecting a predetermined number of increments N;
    B.6.b) comparing the integer index to the predetermined number of increments N; and
    B.6.c) if the integer index is less than the predetermined number of increments N, incrementing the initial permuted inverted data value, incrementing the integer index, and repeating B.6.a)–B.6.b).

13. The method of claim 8, further comprising:
    after inverting the contiguous sub-range to generate the permuted inverted data value, incrementing the permuted inverted data value N times to generate N incremental permuted inverted data values.

14. The method of claim 13, wherein incrementing the permuted inverted data value N times to generate N incremental permuted inverted data values comprises:

B.8.a) setting an integer index to an initial value and selecting a predetermined number of increments N;

B.8.b) comparing the integer index to the predetermined number of increments N; and B.8.c) if the integer index is less than the predetermined number of increments N, incrementing the permuted inverted data value, incrementing the integer index, and repeating B.8.a)–B.8.b).

15. The method of claim 2, further comprising:

D) storing each of the permuted data values in the storage element.

16. The method of claim 1, wherein permuting the code sequence includes permuting an initial context under which the device operates, comprising:

A) selecting a data value, comprised of a range of bits that defines a bit width of the data value and stored in a storage element of the device, to be permuted that in part defines the initial context;

B) setting a sub-range bit width to an initial value, wherein the sub-range bit width defines a number of contiguous sub-ranges of the range of bits from a least significant sub-range to a most-significant sub-range, with each contiguous sub-range of the number of contiguous sub-ranges having a bit width defined by the sub-range width if the bit width of the range of bits is evenly divisible by the initial sub-range width and if the bit width of the range of bits is not evenly divisible by the initial sub-range width the bit width of the most-significant sub-range is determined by a remainder determined by dividing the range of bits bit width by the sub-range width;

C) setting a bit position of the range of bits to an initial value;

D) setting a sub-range index to an initial value;

E) if the sub-range index is less than the number of sub-ranges, comprising:
1. applying an XOR mask to a sub-range of the number of sub-ranges indicated by the bit position to invert the bits of the sub-range and generate a permuted data value and thus a permuted initial context;
2. running the code sequence on the device under the permuted initial context;
3. incrementing the bit position to correspond to a more significant, contiguous sub-range of the plurality of contiguous sub-ranges; and
4. if the bit position is less than the bit width of the range, shifting the XOR mask to the bit position and returning to E1);

F) if the sub-range index is not less than the number of sub-ranges or if the bit position is not less than the bit width of the range, an indication that the range of bits has been permuted, determining whether to again permute the range of bits; and G) if the range of bits is to again be permuted, changing the sub-range bit width and recalculating the number of sub-ranges in view of the changed sub-range bit width, resetting the bit position to the initial value, and resetting the sub-range index to the initial value and returning to E).

17. The method of claim 16, wherein after generating the permuted data value in E.1), further comprising:

incrementing the permuted data value N times to generate N incremental permuted data values.

18. The method of claim 17, wherein incrementing the permuted data value N times to generate N incremental permuted data values comprises:

E.1.a) setting an integer index to an initial value and selecting a predetermined number of increments N;

E.1.b) comparing the integer index to the predetermined number of increments N; and E.1.c) if the integer index is less than the predetermined number of increments N, incrementing the permuted data value, incrementing the integer index, and repeating E.1.a)–E.1.c).

19. The method of claim 16, wherein the initial value of the bit position is a least significant bit of the range of bits.

20. The method of claim 16, wherein the bit position is an offset within the range of bits.

21. The method of claim 16, wherein the initial value of the sub-range index is one.

22. The method of claim 16, wherein changing the sub-range bit width comprises increasing the sub-range bit width.

23. The method of claim 1, wherein permuting the code sequence includes permuting the code sequence itself, comprising:

A. setting an instruction index to a predetermined minimum instruction index value;

B. determining whether the instruction index is less than a predetermined maximum instruction index value;

C. if the instruction index is less than the predetermined maximum instruction index value, determining whether an instruction of the code sequence indicated by the instruction index is permissible to modify, wherein:

C.1) if an instruction of the code sequence indicated by the instruction index is permissible to modify, comprising:

C.1.a) setting a register index of the instruction to a minimum value, wherein the register index indicates the number of register fields of the instruction;

C.1.b) determining whether the register index is less than a predetermined maximum number of register fields in the instruction, wherein:

C.1.b.i) if the register index is less than a predetermined maximum number of register fields in the instruction, comprising:

C.1.b.i.A.) if the register index indicates a register field of the instruction that is permissible to modify, then modifying the register field of the instruction, incrementing the register index, and returning to C.1.b); and C.1.b.i.B) if the register index indicates the register field of the instruction is not permissible to modify, then incrementing the register index, and returning to C.1.b);

C.1.b.ii) if the register index is not less than the predetermined maximum number of register fields in the instruction, comprising:

C.1.b.ii.A) incrementing the instruction index; and

C.1.b.ii.B) returning to B);

C.2) if the instruction of the code sequence indicated by the instruction index is not permissible to modify, comprising:

C.2.a) incrementing the instruction index; and

C.2.b) returning to B).

24. A computer-readable medium having a computer program for performing electrical verification of a device, comprising:

instructions for running a code sequence on the device to generate first results;

instructions for permuting the code sequence; and instructions for running the permuted code sequence on the device to generate second results; and comparing the second results to the first results to determine if there is a match between the second results and the first results.

25. The medium of claim 24, wherein permuting the code sequence includes instructions for permuting an initial context under which the device operates, comprising:
- A) instructions for selecting a data value having a number of bits of a range, stored in a storage element of the device and defined by a plurality of contiguous sub-ranges with each sub-range having a uniform bit width defined by a number of bits except for a most significant sub-range if the number of bits of the range divided by the number of bits of the uniform bit width yields a remainder in which the most significant sub-range has a bit width defined by the remainder, that in part defines the initial context;
- B) instructions for sequentially permuting each contiguous sub-range of the plurality of sub-ranges of the data value to generate a plurality of permuted data values and thus a plurality of permuted initial contexts; and
- C) instructions for running the code sequence on the device under each permuted initial context of the plurality of permuted initial contexts.

26. The medium of claim 25, wherein permuting the data value to generate the permuted data value comprises:
- B.1) instructions for inverting a least significant contiguous sub-range of a plurality of contiguous sub-ranges of the data value to generate an initial permuted data value;
- B.2) instructions for incrementing a bit position within the range of bits of the data value by an amount equal to the bit width of the contiguous sub-range;
- B.3) instructions for inverting a contiguous sub-range indicated by the incremented bit position to generate a permuted data value; and
- B.4) repeating B.2) and B.3) for all remaining contiguous sub-ranges of the plurality of contiguous sub-ranges to generate a plurality of permuted data values, one for each contiguous sub-range, until the range of bits has been fully inverted to generate an inverted data value.

27. The medium of claim 26, further comprising:
after inverting the least significant contiguous sub-range to generate the initial permuted data value, instructions for incrementing the initial permuted data value N times to generate N incremental initial permuted data values.

28. The medium of claim 24, wherein permuting the code sequence includes instructions for permuting an initial context under which the device operates, comprising:
- A) instructions for selecting a data value, comprised of a range of bits that defines a bit width of the data value and stored in a storage element of the device, to be permuted that in part defines the initial context;
- B) instructions for setting a sub-range bit width to an initial value, wherein the sub-range bit width defines a number of contiguous sub-ranges of the range of bits from a least significant sub-range to a most-significant sub-range, with each contiguous sub-range of the number of contiguous sub-ranges having a bit width defined by the sub-range width if the bit width of the range of bits is evenly divisible by the initial sub-range width and if the bit width of the range of bits is not evenly divisible by the initial sub-range width the bit width of the most-significant sub-range is determined by a remainder determined by dividing the range of bits bit width by the sub-range width;
- C) instructions for setting a bit position of the range of bits to an initial value;
- D) instructions for setting a sub-range index to an initial value;
- E) if the sub-range index is less than the number of sub-ranges, comprising:
  1. instructions for applying an XOR mask to a sub-range of the number of sub-ranges indicated by the bit position to invert the bits of the sub-range and generate a permuted data value and thus a permuted initial context;
  2. instructions for running the code sequence on the device under the permuted initial context;
  3. instructions for incrementing the bit position to correspond to a more significant, contiguous sub-range of the plurality of contiguous sub-ranges; and
  4. if the bit position is less than the bit width of the range, instructions for shifting the XOR mask to the bit position and returning to E1);
- F) if the sub-range index is not less than the number of sub-ranges or if the bit position is not less than the bit width of the range, an indication that the range of bits has been permuted, instructions for determining whether to again permute the range of bits; and
- G) if the range of bits is to again be permuted, instructions for changing the sub-range bit width and recalculating the number of sub-ranges in view of the changed sub-range bit width, resetting the bit position to the initial value, and resetting the sub-range index to the initial value and returning to E).

29. The medium of claim 28, wherein after generating the permuted data value in E.1), further comprising:
instructions for incrementing the permuted data value N times to generate N incremental permuted data values.

30. The medium of claim 29, wherein incrementing the permuted data value N times to generate N incremental permuted data values comprises:
- E.1.a) instructions for setting an integer index to an initial value and selecting a predetermined number of increments N;
- E.1.b) instructions for comparing the integer index to the predetermined number of increments N; and
- E.1.c) if the integer index is less than the predetermined number of increments N, incrementing the permuted data value, instructions for incrementing the integer index, and repeating E.1.a)–E.1.c).

31. The medium of claim 24, wherein permuting the code sequence includes instructions for permuting the code sequence itself, comprising:
- A. instructions for setting an instruction index to a predetermined minimum instruction index value;
- B. instructions for determining whether the instruction index is less than a predetermined maximum instruction index value;
- D. if the instruction index is less than the predetermined maximum instruction index value, instructions for determining whether an instruction of the code sequence indicated by the instruction index is permissible to modify, wherein:
  - C.1) if an instruction of the code sequence indicated by the instruction index is permissible to modify, comprising:

C.1.a) instructions for setting a register index of the instruction to a minimum value, wherein the register index indicates the number of register fields of the instruction;

C.1.b) instructions for determining whether the register index is less than a predetermined maximum number of register fields in the instruction, wherein:

C.1.b.i) if the register index is less than a predetermined maximum number of register fields in the instruction, comprising:

C.1.b.i.A.) if the register index indicates a register field of the instruction that is permissible to modify, then instructions for modifying the register field of the instruction, incrementing the register index, and returning to C.1.b); and C.1.b.i.B) if the register index indicates the register field of the instruction is not permissible to modify, then instructions for incrementing the register index, and returning to C.1.b);

C.1.b.ii) if the register index is not less than the predetermined maximum number of register fields in the instruction, comprising:

C.1.b.ii.A) instructions for incrementing the instruction index; and

C.1.b.ii.B) returning to B);

C.2) if the instruction of the code sequence indicated by the instruction index is not permissible to modify, comprising:

C.2.a) instructions for incrementing the instruction index; and

C.2.b) returning to B).

* * * * *